[12] United States Patent
Liao et al.

(10) Patent No.: US 12,517,425 B2
(45) Date of Patent: Jan. 6, 2026

(54) RETICLE ENCLOSURE FOR LITHOGRAPHY SYSTEMS

(71) Applicant: TAIWAN SEMICONDUCTOR MANUFACTURING COMPANY, LTD., Hsinchu (TW)

(72) Inventors: Chi-Hung Liao, Sanchong (TW); Po-Ming Shih, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 56 days.

(21) Appl. No.: 17/461,433

(22) Filed: Aug. 30, 2021

(65) Prior Publication Data

US 2023/0064383 A1    Mar. 2, 2023

(51) Int. Cl.
*G03F 1/66* (2012.01)
*G03F 1/22* (2012.01)
*G03F 7/00* (2006.01)
*H01L 21/673* (2006.01)

(52) U.S. Cl.
CPC ............... *G03F 1/66* (2013.01); *G03F 1/22* (2013.01); *G03F 7/70033* (2013.01); *H01L 21/67359* (2013.01)

(58) Field of Classification Search
CPC .... G03F 1/66; G03F 7/70033; G03F 7/70708; G03F 7/70741; G03F 7/70916; H01L 21/67359; H01L 21/67353; H01L 21/67396

USPC .......................................................... 206/710
See application file for complete search history.

(56) References Cited

U.S. PATENT DOCUMENTS

| | | | |
|---|---|---|---|
| 6,247,599 B1 * | 6/2001 | Cheng | H05K 9/0067 428/34.4 |
| 6,286,684 B1 * | 9/2001 | Brooks | H01L 21/67396 206/523 |
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,741,710 B2 * | 8/2017 | Cho | H01L 27/0248 |
| 9,869,928 B2 | 1/2018 | Huang et al. | |
| 9,869,934 B2 | 1/2018 | Huang et al. | |
| 9,869,939 B2 | 1/2018 | Yu et al. | |
| 2005/0238922 A1 * | 10/2005 | Kinoshita | C03C 17/3626 204/192.27 |
| 2008/0160235 A1 * | 7/2008 | Wu | H01L 21/67396 428/34.1 |
| 2008/0302701 A1 * | 12/2008 | Lee | H05K 9/0067 206/719 |

(Continued)

*Primary Examiner* — Orlando E Aviles
*Assistant Examiner* — Jenine Pagan
(74) *Attorney, Agent, or Firm* — STUDEBAKER BRACKETT PLLC (57) ABSTRACT

A reticle enclosure includes a base including a first surface, a cover including a second surface and disposed on the base, wherein the base and the cover form an internal space therebetween that includes a reticle, and a layer of electrostatic discharge material disposed on the first surface, wherein the electrostatic discharge material reduces electrostatic charges on the reticle.

20 Claims, 10 Drawing Sheets

(56) References Cited

U.S. PATENT DOCUMENTS

| | | | |
|---|---|---|---|
| 2009/0321306 A1* | 12/2009 | Rider | H01L 21/67353 206/719 |
| 2015/0083638 A1* | 3/2015 | Corbin | H01L 21/67379 53/410 |
| 2019/0155139 A1* | 5/2019 | Chang | G03F 1/40 |
| 2020/0243360 A1* | 7/2020 | Huang | H01T 23/00 |
| 2020/0335386 A1* | 10/2020 | Hung | H01L 21/6719 |

* cited by examiner

RETICLE ENCLOSURE FOR LITHOGRAPHY SYSTEMS

BACKGROUND

A lithographic apparatus projects a pattern from a patterning device (e.g., a photo mask) onto a layer of radiation-sensitive material (resist) provided on the semiconductor substrate. When a photo mask is not used (stored) or transferred from a storage to an lithography apparatus, such as a stepper or a scanner, the photo mask is appropriately protected from contamination such as dust or particles by being placed in a mask case (pod).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

The present disclosure is generally related to extreme ultraviolet (EUV) lithography system and methods. Embodiments disclosed herein are directed to an improved design of an extreme ultraviolet (EUV) reticle pod used for transporting and storing photo masks or blank substrates, and more specifically, to an EUV reticle pod that is designed to reduce residual electrostatic charges on a reticle handled by the EUV reticle pod and thereby limit particles that are attracted to the reticle due to the residual electrostatic charges on the reticle. As a result, particulate matter is limited from being deposited on the reticle when the reticle is positioned on the EUV reticle pod. By reducing the particulate matter on the reticle, errors during reticle exposure are reduced and the contamination of the extreme ultraviolet lithography system (e.g., of the exposure tool) is also reduced.

A semiconductor chip patterned using photolithography (for example, extreme ultraviolet photolithography or EUV photolithography using 13.5 nm wavelength for patterning) requires a mask or a photo-mask (also called a 'reticle') which is contained in a standardized carrier for transfer to different positions in a clean room or in different clean rooms for different processes. For example, a blank substrate is transferred in the standardized carrier using manual or robotic methods to different locations or clean rooms for cleaning and mask fabrication. The fabricated mask is also transferred inside the standardized carrier to different locations or clean rooms for photolithography processes, or storage before or after use. The mask carrier (also referred to as a mask container, a mask pod, or a mask box) includes an inner pod enclosed within an outer pod. The inner pod contacts the blank substrate or mask, and includes an inner pod cover and an inner pod base. The inner pod cover and the inner pod base of the inner pod are designed to fit each other with high accuracy.

A semiconductor substrate processing system includes a load port configured to load a mask carrier including a reticle to the semiconductor substrate processing system or remove a mask carrier from the semiconductor substrate processing system. The mask carrier is handled using robotic apparatuses such as a robotic arm. The robotic arm includes a multi-axis robot manipulator and is configured for handling the mask carrier. The robotic arm opens the outer pod to retrieve the inner pod. The inner pod is provided to a subsequent stage of the semiconductor substrate processing system for storing until the reticle contained therein is required. When the reticle is required, the inner pod is opened, and the reticle is retrieved using a robotic arm.

The robotic arm includes an electrostatic chuck (e-chuck) having one or more chucking electrodes that, while receiving a voltage, provide electrostatic attraction to secure the reticle to the electrostatic chuck. Using the electrostatic chuck, the robotic arm is able to grasp the reticle by electrostatic attraction and provide it to a succeeding stage (e.g., a reticle stage) of the semiconductor substrate processing system.

After use, the robotic arm returns the reticle to the inner pod. In doing so, the robotic arm is positioned over the base of the inner pod and the electrostatic attraction is released. This releases the reticle from the robotic arm's grasp, and the reticle is placed on the inner pod.

After release, the reticle can have residual electrostatic charges on it. The residual electrostatic charges attract the particulate matter. For instance, particulate matter that may be present in the vicinity of the reticle (e.g., the inner pod cover and/or the inner pod base) can get attracted to and deposited on the reticle. These particles contaminate the environment of the inner pod and the environment of the lithography system, in general, and could damage the patterns on the mask or the blank substrate or block the EUV radiation causing fabrication errors. The particles can also damage masks and, as result, increase the production cost, increase manufacturing time, and require expensive systems for checking the defects in the mask.

The reticle (photo mask or patterning device) is protected from particle contamination by a pellicle. While the reticle is provided with a pellicle to avoid particles (contaminants) from depositing on the patterned surface of the reticle, it is still beneficial to further limit the particles from being attracted to the reticle. These particles may introduce defects into the pattern projected on the semiconductor substrate. It is desirable to limit these particles from depositing on the reticle and/or the pellicle.

The need for protection from particulate matter contaminating objects of interest (e.g., the mask) is required in many fields of application, including applications in semiconductor manufacturing such as extreme ultraviolet lithography. A lithographic apparatus projects a pattern from a patterning device (e.g., a photo mask) onto a layer of radiation-sensitive material (resist) provided on the semiconductor substrate. The wavelength of radiation used by a lithographic apparatus to project a pattern onto a substrate determines the minimum size of features that can be formed on that substrate. A lithographic apparatus that uses extreme ultraviolet radiation, being electromagnetic radiation having a wavelength within the range 4-20 nm, may be used to form smaller features on a substrate than a conventional lithographic apparatus (which may for example use electromagnetic radiation with a wavelength of 193 nm).

It should be noted that, although embodiments are discussed herein with reference to EUV lithography systems, embodiments are not limited in this regard. The mask pod, according to embodiments discussed herein, can be used in other types of lithography systems (e.g., deep ultraviolet (DUV) lithography systems), without departing from the scope of the disclosure. Additionally, embodiments discussed herein are not limited to any particular stage of the lithography systems and equally applicable any stage of the lithography systems that handles reticles. Embodiments disclosed herein can also be used in other fields of application where it is required to discharge electrostatic charges.

Figure 1A:
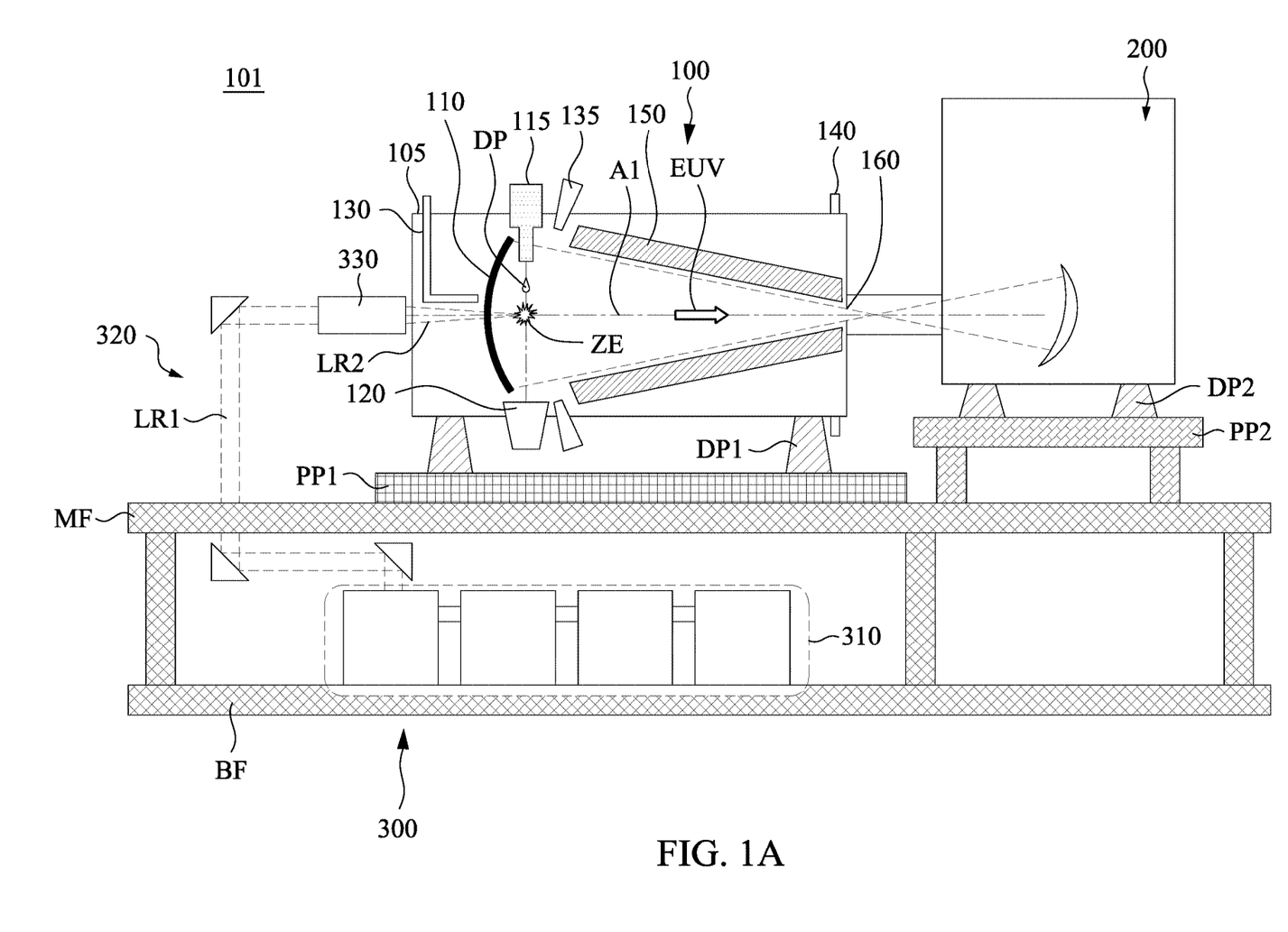
FIG. 1A is a schematic view of an extreme ultraviolet (EUV) lithography system with a laser produced plasma (LPP) EUV radiation source, constructed in accordance with some embodiments of the present disclosure.

FIG. 1A is a schematic and diagrammatic view of an EUV lithography system 101. The EUV lithography system 101 includes an EUV radiation source apparatus 100 to generate EUV light, an exposure tool 200, such as a scanner, and an excitation laser source apparatus 300. As shown in FIG. 1A, in some embodiments, the EUV radiation source apparatus 100 and the exposure tool 200 are installed on a main floor MF of a clean room, while the excitation source apparatus 300 is installed in a base floor BF located under the main floor. Each of the EUV radiation source apparatus 100 and the exposure tool 200 are placed over pedestal plates PP1 and PP2 via dampers DP1 and DP2, respectively. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

Figure 1B:
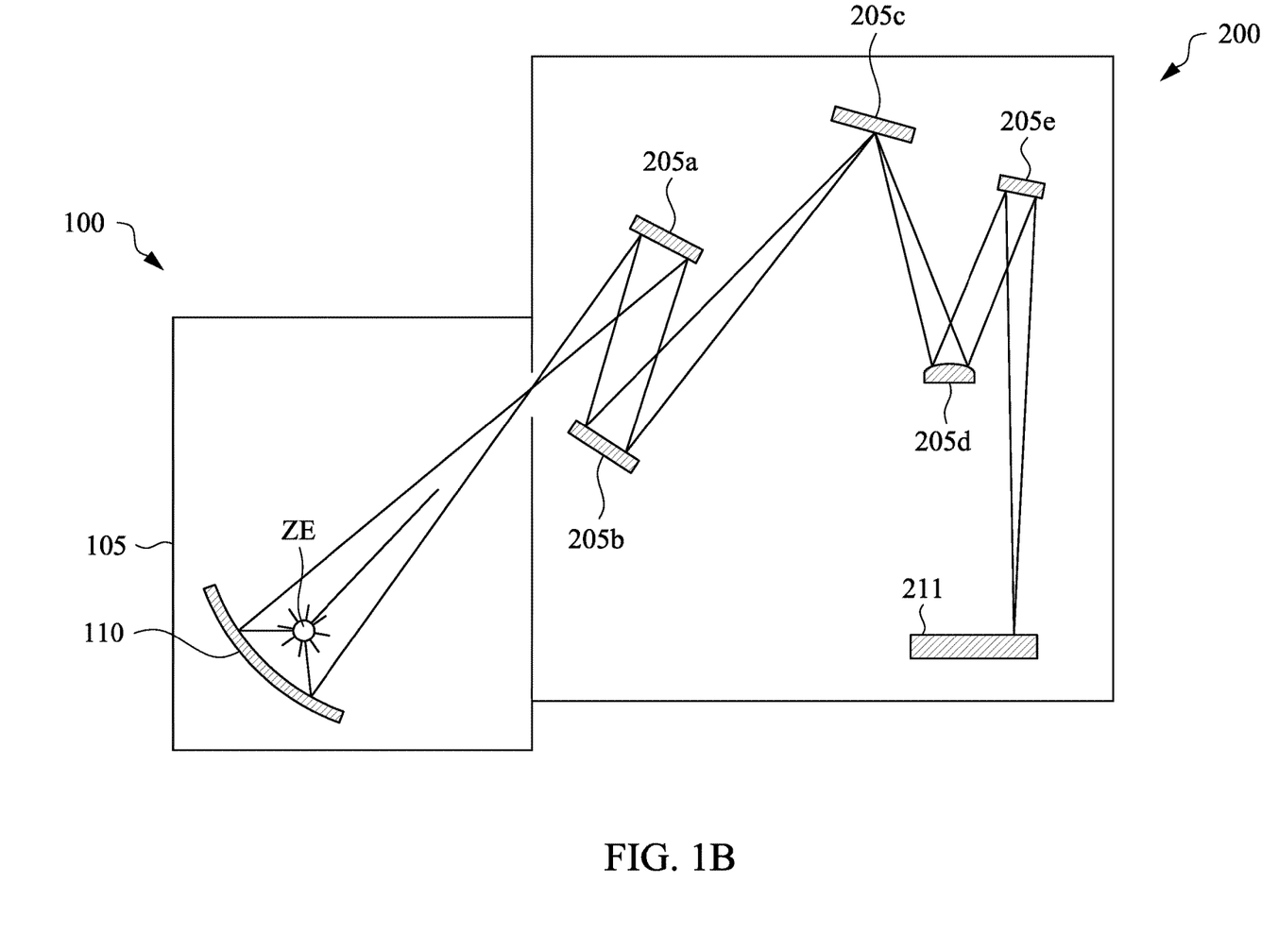
FIG. 1B is a schematic view of an EUV lithography system exposure tool according to embodiments of the disclosure.

FIG. 1B is a simplified schematic diagram of the exposure tool 200 according to an embodiment of the disclosure showing the exposure of photoresist coated substrate 211 with a patterned beam of EUV light. The exposure tool 200 is an integrated circuit lithography tool such as a stepper, scanner, step and scan system, direct write system, device using a contact and/or proximity mask, etc., provided with one or more optics 205a, 205b, for example, to illuminate a patterning optic, such as a reticle 205c, with a beam of EUV light, to produce a patterned beam, and one or more reduction projection optics 205d, 205e, for projecting the patterned beam onto the substrate 211. The one or more optics 205a, 205b provide the beam of EUV light with a desired cross-sectional shape and a desired angular distribution. The reticle 205c is protected by a pellicle, which is held in place by a pellicle frame. The reticle 205c reflects and patterns the beam of EUV light.

Figure 1C:
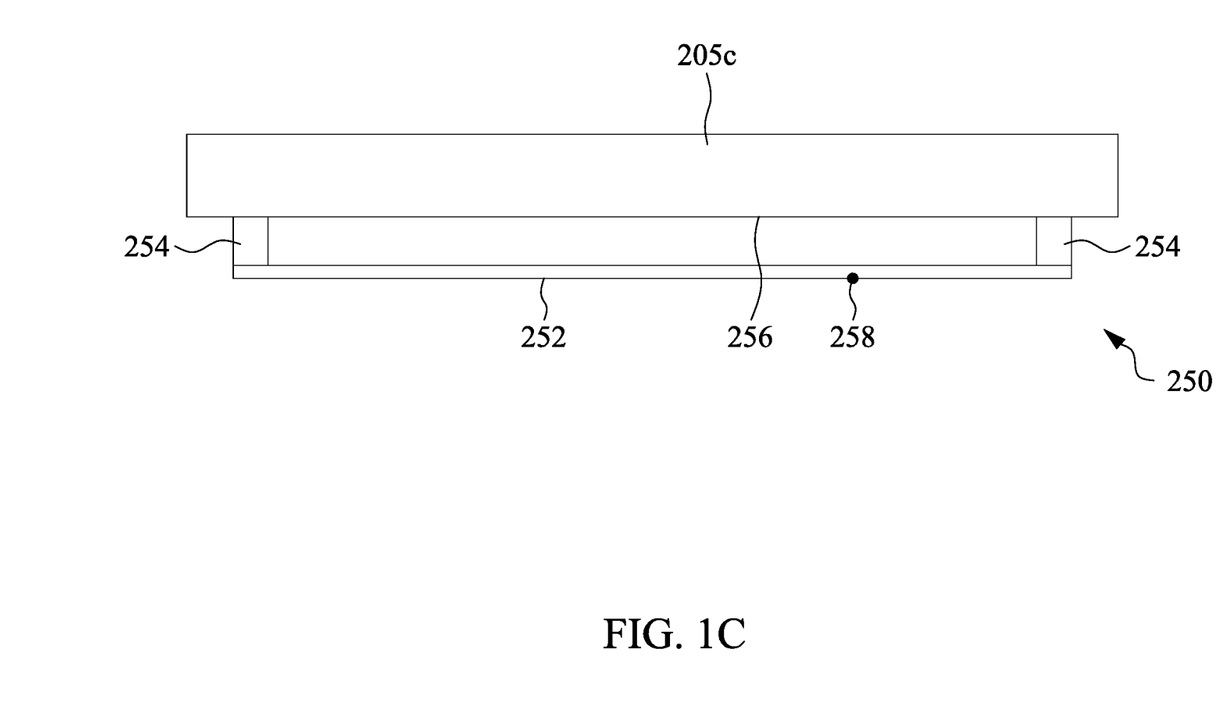
FIG. 1C illustrates a schematic pellicle assembly installed on a reticle placed in the EUV lithography system of FIG. 1A.

Referring briefly to FIG. 1C, illustrated is a schematic pellicle assembly 250 installed on the reticle 205c in relative detail. The pellicle assembly 250 includes a pellicle 252 and the pellicle frame 254. The reticle 205c has a patterned surface 256. The pellicle frame 254 supports the pellicle 252 around a perimeter portion of the pellicle 252 and is removably attachable to the reticle 205c.

The pellicle 252 holds a contaminant, e.g., contamination particle 258, at a distance from the patterned surface 256 of the reticle 205c such that the contamination particle 258 is not in the focal plane of the beam of EUV radiation and is thus not imaged onto the substrate 211 (FIG. 1B).

Returning to FIG. 1B, following reflection from the reticle the patterned beam of EUV light is provided to the one or more optics 205a, 205b and is in turn projected onto the substrate 211 held by a mechanical assembly (e.g., substrate table). In some embodiments, the one or more optics 205a, 205b apply a reduction factor to the radiation beam, forming an image with features that are smaller than corresponding features on the reticle. The mechanical assembly may be provided for generating a controlled relative movement between the substrate 211 and reticle 205c.

The EUV lithography system may, for example, be used in a scan mode, wherein the chuck and the mechanical assembly (e.g., substrate table) are scanned synchronously while a pattern imparted to the radiation beam is projected onto the substrate 211 (i.e. a dynamic exposure). The velocity and direction of the substrate table relative to the chuck is determined by the demagnification and image reversal characteristics of the exposure tool 200. The patterned beam of EUV radiation that is incident upon the substrate 211 comprises a band of radiation. The band of radiation is referred to as an exposure slit. During a scanning exposure, the movement of the substrate table and the chuck is such that the exposure slit travels over an exposure field of the substrate 211. As further shown in FIG. 1B, the EUVL tool includes an EUV radiation source 100 including plasma at ZE emitting EUV light in a chamber 105 that is collected and reflected by a collector 110 along a path into the exposure tool 200 to irradiate the substrate 211.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes $TiO_2$ doped $SiO_2$, or other suitable materials with low thermal expansion. The mask includes multiple reflective multiple layers deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes.

The lithography system may further include other modules or be integrated with (or be coupled with) other modules. As shown in FIG. 1A, the EUV radiation source 100 includes a target droplet generator 115 and a LPP collector 110, enclosed by a chamber 105. The target droplet generator 115 generates a plurality of target droplets DP. In some embodiments, the target droplets DP are tin (Sn) droplets. In some embodiments, the tin droplets each have a diameter about 30 microns (μm). In some embodiments, the tin droplets DP are generated at a rate about 50 droplets per second and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 300 is a pulse laser. In some embodiments, the excitation layer includes a pre-heat laser and a main laser. The pre-heat laser pulse is used to heat (or pre-heat) the target droplet to create a low-density target plume, which is subsequently heated (or reheated) by the main laser pulse, generating increased emission of EUV light. In various embodiments, the pre-heat laser pulses have a spot size about 100 μm or less, and the main laser pulses have a spot size about 200-300 μm.

The laser pulses LR2 are generated by the excitation laser source 300. The laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source. The laser light LR1 generated by the laser generator 300 is guided by the laser guide optics 320 and focused into the excitation laser LR2 by the focusing apparatus 330, and then introduced into the EUV radiation source 100.

The laser light LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation, which is collected by the collector mirror 110. The collector 110 has a reflection surface that reflects and focuses the EUV radiation for the lithography exposing processes. In some embodiments, a droplet catcher 120 is installed opposite the target droplet generator 115. The droplet catcher 120 is used for catching excess target droplets. For example, some target droplets may be purposely missed by the laser pulses.

The collector 110 includes a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes multiple layers (such as a plurality of Mo/Si film pairs) and may further include a capping layer (such as Ru) coated on the multiple layers to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern in some embodiments.

In such an EUV radiation source apparatus, the plasma caused by the laser application creates debris, such as debris droplets due to the tine droplet being missed by the laser beam or the tin droplet not interact sufficiently with the laser beam, or some tin leftover from the plasma formation process. It is necessary to prevent the accumulation of debris and other material on the collector 110 and also to limit the debris from exiting the chamber 105 and entering the exposure tool 200.

As shown in FIG. 1A, in some embodiments, a buffer gas is supplied from a first buffer gas supply 130 through the aperture in collector 110 by which the pulse laser is delivered to the tin droplets. In some embodiments, the buffer gas is $H_2$, He, Ar, $N_2$, or another inert gas. In certain embodiments, $H_2$ is used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching to the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 200.

To trap the $SnH_4$ or other debris, one or more debris collection mechanisms or devices 150 are employed in the chamber 105. As shown in FIG. 1A, one or more debris collection mechanisms or devices 150 are disposed along optical axis A1 between the zone of excitation ZE and an output port 160 of the EUV radiation source 100.

Figure 2:
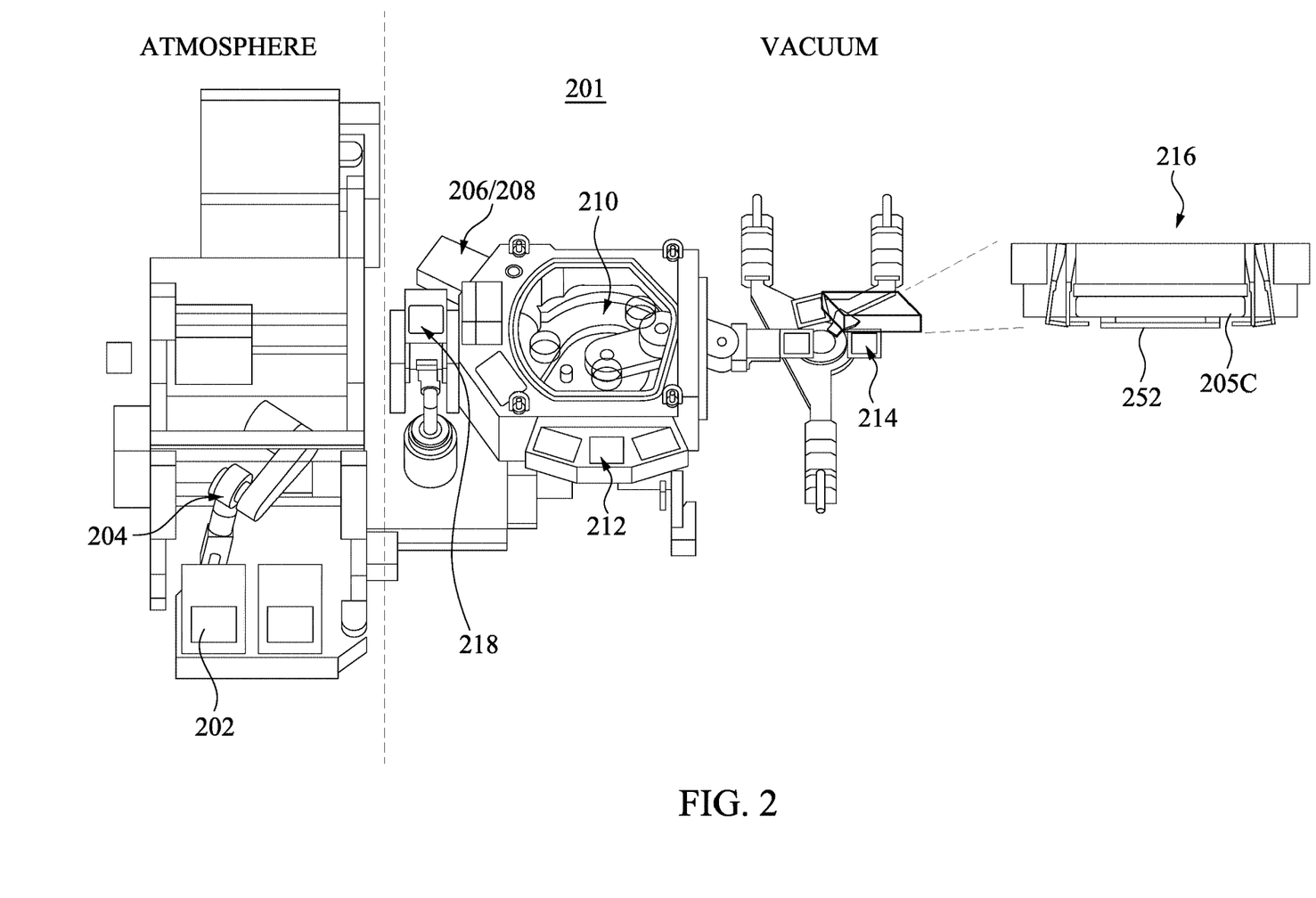
FIG. 2 illustrates a top view of an exemplary layout of different stages (or stations) with an extreme ultraviolet lithography system.

FIG. 2 illustrates a layout of different stages (or stations) of a reticle handling system 201, according to embodiments.

In some embodiments, the reticle handling system 201 is used in an extreme ultraviolet (EUV) lithography system. The reticle handling system 201 is used in conjunction with the exposure tool 200 (FIG. 1B) for receiving and storing a reticle 205c that is then provided to the exposure tool 200 for exposing to a beam of EUV radiation. As illustrated, the reticle handling system 201 includes a load port 202, an out of vacuum robot (OVR) 204, a reticle backside inspection (RBI) stage 206, a barcode reader 208, an in-vacuum robot (IVR) 210, an in-vacuum library (IVL) 212, a rapid exchange device (RED) 214, and a reticle stage (RS) 216 (e.g., including the reticle 205c). The reticle handling system 201 can include one or more additional stages or some of the stages can be omitted, and the embodiments are not limited thereto. The load port 202 and the out of vacuum robot (OVR) 204 are located in an atmospheric pressure environment while the reticle backside inspection (RBI) stage 206, the barcode reader 208, the in-vacuum robot (IVR) 210, the in-vacuum library (IVL) 212, the rapid exchange device (RED) 214, and the reticle stage (RS) 216 are located in a vacuum environment. Access between the vacuum environment and the atmospheric pressure environment is controlled by a load lock chamber 218. For instance, the load lock chamber 218 is located between the out of vacuum robot (OVR) 204 and the in-vacuum library (IVL) 212.

The load port 202 serves as an entry point to the reticle handling system 201 via which a reticle (e.g., reticle 205c in FIG. 1C) is introduced into the reticle handling system 201. In an embodiment, the reticle 205c including the pellicle 252 is enclosed within a clean filter pod (CFP) which in turn is enclosed in a reticle carrier, also known as a reticle standard manufacturing interface ("SMIF") pod, or RSP. The reticle standard manufacturing interface pod permits handling and transportation of the reticle 205c outside of the reticle handling system 201, for example, in an ambient environment. The reticle standard manufacturing interface pod is shaped and sized (or otherwise configured) to be received into the load port 202.

In some embodiments, adjacent to the load port 202 is a RSP library. In some embodiments, reticle standard manufacturing interface pod is placed by load port 202 into RSP library. The RSP library is a repository or storage for multiple reticle standard manufacturing interface pods each including a reticle. When a particular reticle is required, the reticle standard manufacturing interface pod containing the required reticle is retrieved from the RSP library.

In some embodiments, the out of vacuum robot (OVR) 204 retrieves the reticle standard manufacturing interface pod containing the required reticle for providing the reticle to the load lock chamber 218. In some embodiments, the out of vacuum robot (OVR) 204 is also configured to open the reticle standard manufacturing interface pod and remove the clean filter pod including the reticle. A vacuum pump is connected to load lock chamber 218 and forms a vacuum environment inside load lock chamber 218. The load lock chamber 218 is sandwiched by two valves for controlling the pressure in the load lock chamber 218 The load lock chamber 218 provides an interface between the stages of the reticle handling system 201 at atmospheric pressure and the stages of the reticle handling system 201 in vacuum, such that extreme ultraviolet lithography mask can be transferred between atmospheric pressure condition and vacuum condition.

The reticle backside inspection (RBI) stage 206 is located adjacent the load lock chamber 218 and includes the equipment to measure and clean the backside of the reticle 205c to limit the particles on the backside of the reticle 205c. In an embodiment, the reticle backside inspection (RBI) stage 206 includes one or more of an optical system for detecting particles on the backside of the reticle 205c, a measuring system for measuring size of the particles, a cleaning system for cleaning the backside of the reticle 205c, and an inspection system for inspecting the backside of the reticle 205c. The reticle 205c must be kept very flat when attached to chuck. Therefore, it is also important to prevent relatively large particles, (e.g., 1 μm), or layers of smaller particles from migrating to the backside of reticle 205c, which is the surface of the reticle 205c that contacts the chuck. Particles on the backside can distort the reticle 205c and cause focusing and overlay errors. The backside particles can also migrate to the support structure securing the reticle 205c during exposure and cause similar problems for all subsequent reticles that are handled by the support structure. The barcode reader 208 identifies the reticle 205c and the pattern formed thereon.

The in-vacuum robot (IVR) 210 is located adjacent the load lock chamber 218 and operates to transport the reticle 205c (or, as the case may be, the reticle standard manufacturing interface pod including clean filter pod, or the clean filter pod if removed by the out of vacuum robot 204) from the load lock chamber 218 to the in-vacuum library (IVL) 212 for temporarily storing the reticle 205c before use. In some embodiments, when the particular reticle is needed, the in-vacuum robot (IVR) 210 retrieves the desired reticle from the in-vacuum library (IVL) 212 and provides the reticle to the rapid exchange device (RED) 214. In some other embodiments, the rapid exchange device (RED) 214 retrieves the desired reticle from the in-vacuum library (IVL) 212.

During manufacture of integrated circuits using a lithographic apparatus, different reticles are used to generate different circuit patterns to be formed on different layers in the integrated circuit. Thus, during the manufacturing different layers of the integrated circuit the different reticles must be changed. The rapid exchange device (RED) 214 (also referred to as a reticle exchange device) is used to change reticles during the lithography process in the least possible amount of time.

The reticle stage 216 includes a support structure, which, for example, is an electrostatic chuck, for securing the reticle 205c in place during the lithography process. The pellicle 252 is positioned over the reticle 205c to protect the reticle 205c from particles, dust, damage and/or contamination.

Figure 3A:
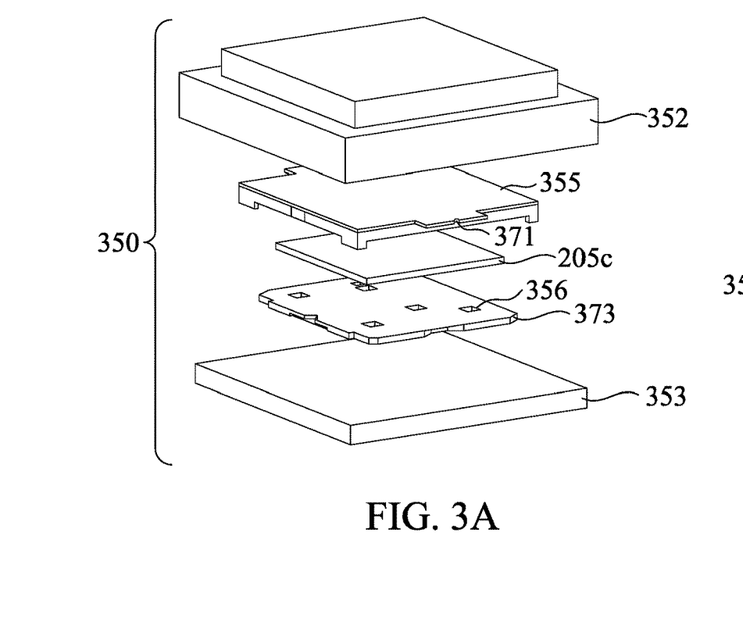
FIG. 3A is a schematic exploded view and FIG. 3B is a cross-sectional diagram illustrating an EUV reticle pod.
Figure 3B:
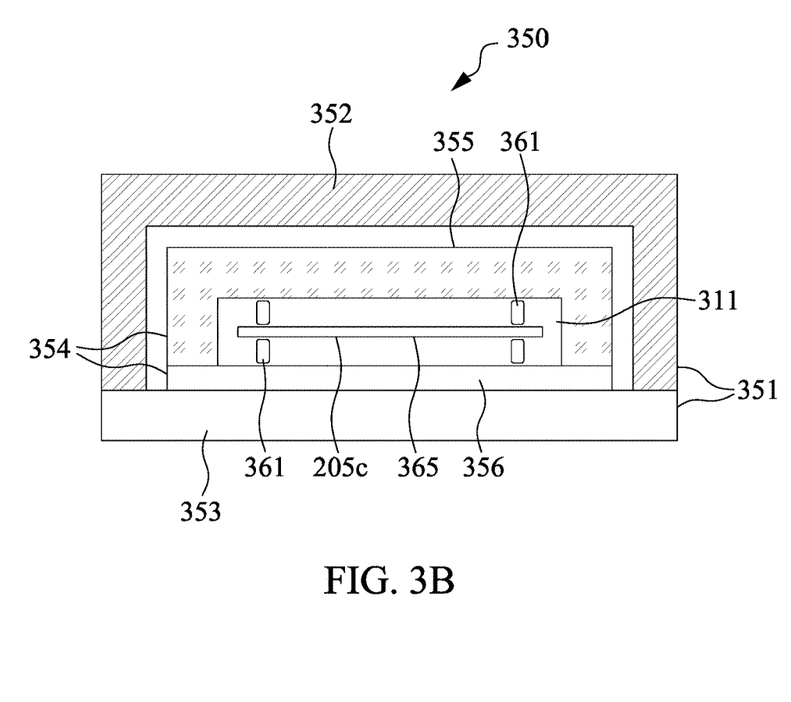

FIG. 3A is an exploded view of a perspective view of a reticle pod 350. FIG. 3B is a schematic cross-sectional view of the reticle pod 350. A reticle (e.g., reticle 205c) is stored, transported, and loaded into a lithography system by the reticle pod, e.g., a SMIF pod, 350. The reticle pod 350 is a container including two pods, one inside the other, which protect the reticle from contamination. The reticle pod 350 has an outer pod that encases an inner pod. The inner pod holds the reticle directly. The dual pod including the reticle is provided to the reticle handling system 201 (FIG. 2). When received, the reticle handling system 201 initially opens the outer pod to retrieve the inner pod including the reticle. The inner pod containing the reticle is temporarily stored until the reticle is required for use.

As illustrated, the reticle 205c is stored in an inner pod 354. The inner pod 354 includes an inner pod base 356 and an inner pod cover 355. The reticle 205c is stored face down in the inner pod 354. More specifically, the printed or patterned surface 365 (also referred to as the front face) of reticle 205c faces the inner pod base 356 and the backside surface 367 of reticle 205c faces the inner pod cover 355.

For the sake of clarity of illustration, the pellicle is not shown over the patterned surface 365. However, it should be noted that a pellicle (e.g., pellicle 252) is installed on the reticle 205c within one or more restraining mechanisms 361. The inner pod base 356 includes the one or more restraining mechanisms 361 to reduce sliding or movement of the reticle 205c and thereby secure the reticle 205c in the inner pod 354. Alternatively, or additionally, the inner pod cover 355 includes one or more restraining mechanisms 361 to secure the reticle 205c in place. By way of example, restraining mechanisms 361 include a clamp, a groove, a pin, a fixation block, and a spring. The inner pod cover 355 couples to the inner pod base 356 to define an internal space 311 or internal environment of the reticle pod 350. The reticle 205c is located in the internal space 311 between the inner pod base 356 and inner pod cover 355.

In some embodiments, the inner pod cover 355 and inner pod base 356 are made of nickel coated aluminum alloy. In some embodiments, the nickel coating is Ni—P or Ni—Cr.

The inner pod 354 is securely contained in an outer pod 351. In some embodiments, the outer pod is a reticle standard manufacturing interface ("SMIF") pod (RSP). The outer pod 351 includes an outer base 353 and an outer cover 352. Similar to the inner pod cover 355 and the inner pod base 356, the outer base 353 couples to the outer cover 352, effectively sandwiching the inner pod 354 between the outer base 353 and the outer cover 352. The inner pod 354 rests securely on the outer base 353 with the outer cover 352 closed with outer base 353.

The inner and outer pods 354, 351 are designed in a manner that facilitates their opening, closing, and general manipulation. For example, the inner and outer pods 354, 351 are designed to include robotic handling flanges, latch-pin holes, pins, conveyor rails, end effector exclusion volumes, secondary and primary side robotic handling flanges, features for reticle alignment and data matrix identification, registration pin features, features which mate with kinematic-coupling pins, and the like.

Embodiments of the disclosure are directed to an inner pod including a coating on the surfaces of the inner pod base. The coating is of a material that reduces the electrostatic charges of the reticle and thereby limits particles from being attracted by the reticle and deposited on the reticle. As a result, the reticle (and the pellicle) is kept relatively contaminant free. In some embodiments, the inner pod cover is also coated with the material for reducing the electrostatic charges on the reticle.

Figure 4A:
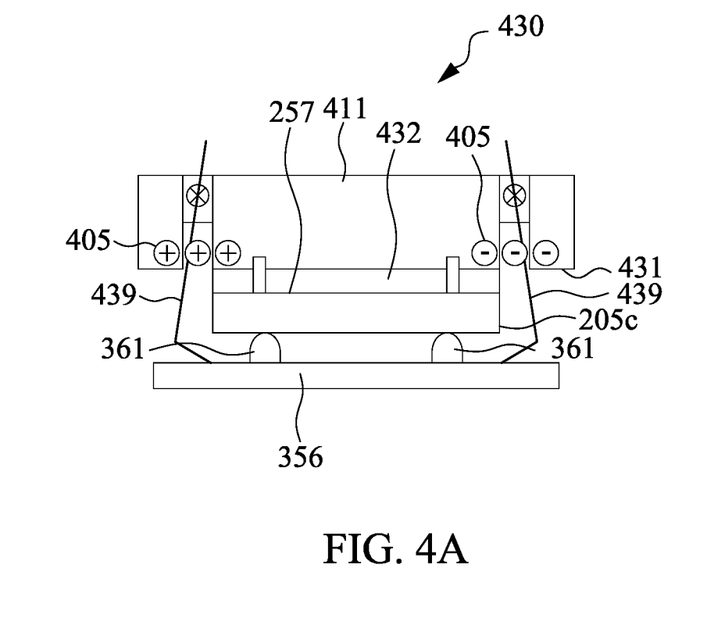
FIG. 4A illustrates a reticle that is clamped by an electrostatic chuck.

FIG. 4A illustrates a reticle 205c that is clamped by an electrostatic chuck 430. As discussed above, when the reticle 205c, which is positioned over the inner pod base 356, is required, the inner pod 354 is opened, and the reticle 205c is retrieved using a robotic arm. The robotic arm includes the electrostatic chuck 430 having a dielectric body 411. The dielectric body 411 has a chuck surface 431 including one or more chucking electrodes 432. The chuck surface 431 faces a backside 257 of the reticle 205c. The chucking electrodes 432, while receiving a voltage, provide electrostatic attraction (generally indicated by the charges 405) to stably secure the reticle 205c via the backside 257. The supplied voltage is about 1 kilovolt (kV) DC (direct-current), for example. The electrostatic chuck 430 includes multiple clamping mechanisms 439 configured to extend to the edge of the reticle 205c. For example, when the reticle 205c is clamped on the electrostatic chuck 430 by electrostatic attraction, the clamping mechanisms 439 is operated to move toward the edge of the reticle 205c to prevent the reticle 205c from falling undesirably from the electrostatic chuck 430. On the other hand, the clamping mechanisms 439 are operated to move away from the edge of the reticle 205*c* before the reticle 205*c* is removed from the electrostatic chuck 430.

After the reticle 205*c* is placed on the one or more restraining mechanisms 361 of the inner pod base 356, the clamping mechanisms 439 are operated to move away from the reticle 205*c* edge and the electrostatic attraction of the electrostatic chuck 430 is released. This causes the electrostatic chuck 430 to release the reticle 205*c* and the reticle 205*c* is positioned on the one or more restraining mechanisms 361.

The arrangement including the electrostatic chuck 430, the reticle 205*c*, and the inner pod base 356 act as a capacitor. As the electrostatic chuck 430 is moved away from the reticle 205*c*, the capacitance changes due the changing distance between the electrostatic chuck 430 and the reticle 205*c* and the inner pod base 356. This results in charges accumulating on the reticle 205*c*.

Figure 4B:
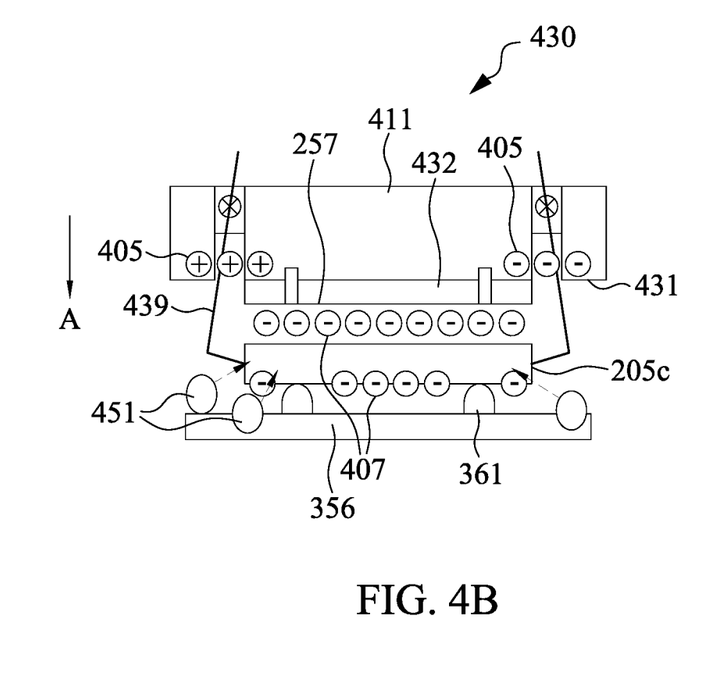
FIG. 4B illustrates residual electrostatic charges on the reticle when the electrostatic chuck is released from the reticle.

As illustrated in FIG. 4B, due to the residual electrostatic charge (also referred to as static electricity, and generally indicated by charges 407) on the reticle 205*c*, when the electrostatic attraction of the electrostatic chuck 430 is released, particles 451 (contaminants) on the inner pod base 356 are attracted to the reticle 205*c*. These particles 451 get deposited (stuck) to the reticle 205*c*, for example, on the patterned surface 256 and the backside 257. It is therefore desirable to provide an inner pod that limits particles from being attracted to the reticle 205*c*. Although the inner pod base 356 is illustrated as including the particles 451, particles can be present on the inner pod cover 380 or other components of the lithography system.

It should be noted that the charges 405 and 407 are indicated as having positive (+) and negative (−) polarity in FIGS. 4A and 4B solely for the sake of illustration. Also, for the sake of clarity of illustration, the pellicle is not illustrated on the reticle 205*c*.

Figure 5A:
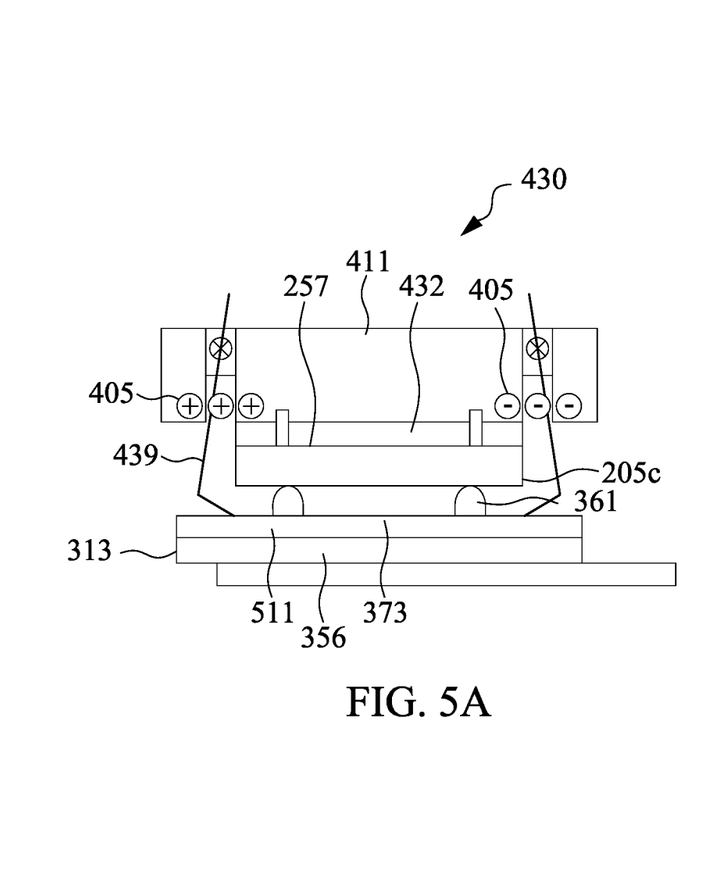
FIG. 5A illustrates an inner pod base including a coating on a surface thereof, according to embodiments of the disclosure.
Figure 5B:
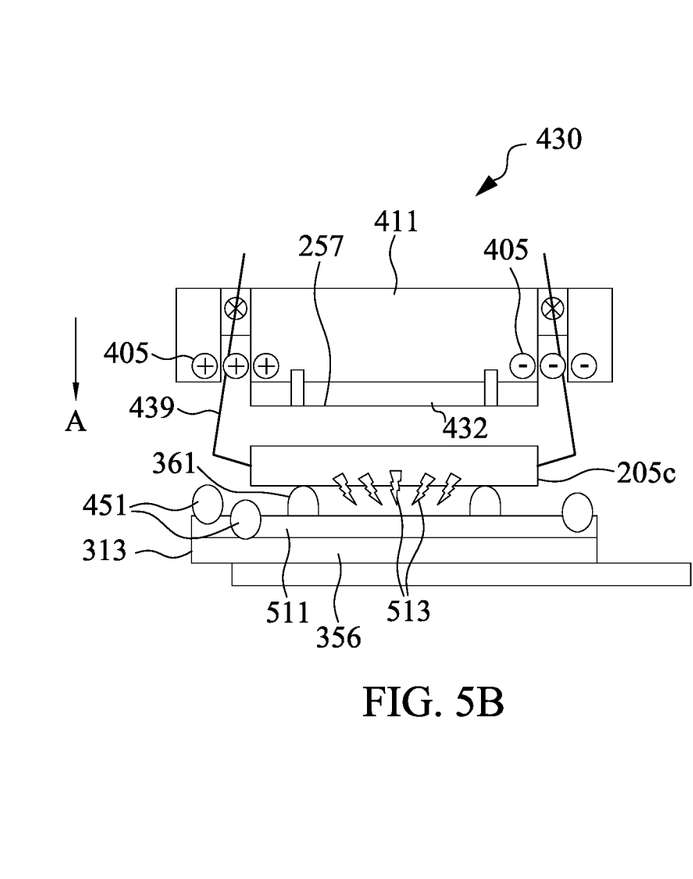
FIG. 5B illustrates the positioned on the inner pod base having the coating, according to embodiments of the disclosure.

FIG. 5A illustrates an inner pod base 356 including a coating 511 on a surface thereof, according to embodiments of the disclosure. FIG. 5B illustrates the reticle 205*c* positioned on the inner pod base 356 having the coating 511, according to embodiments of the disclosure.

Referring to FIGS. 5A and 5B, with continued references to FIGS. 4A and 4B, the coating 511 discharges (generally indicated at 513) the residual electrostatic charges 407 from the reticle 205*c*. Thus, the residual electrostatic charges 407 on the reticle 205*c* are substantially reduced and particles 451 are not attracted to the reticle 205*c*. The reticle 205*c* is thus maintained relatively contamination free.

In some embodiments, the coating 511 includes polonium (Po-210). Polonium (Po-210) is a radioactive source that produces ions (positively or negatively charged particles) in the surrounding. These ions attract opposite charged ions and thereby neutralize the electrostatic charges. As a result, any charges (e.g., the residual electrostatic charges 407) that have accumulated on the reticle 205*c* are neutralized.

It should be noted that the residual electrostatic charges 407 may not be entirely eliminated, but are substantially reduced to a level such that particles 451 are not attracted to the reticle 205*c*.

Figure 5C:
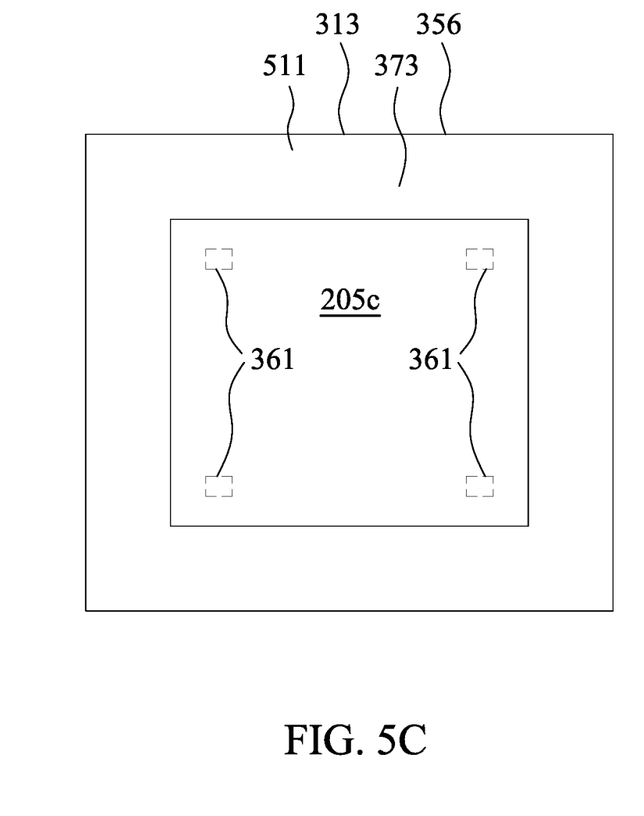
FIG. 5C illustrates a plan view of the inner pod cover in FIG. 5B including the coating deposited on an entire upper surface of inner pod base, according to embodiments of the disclosure.
Figure 5D:
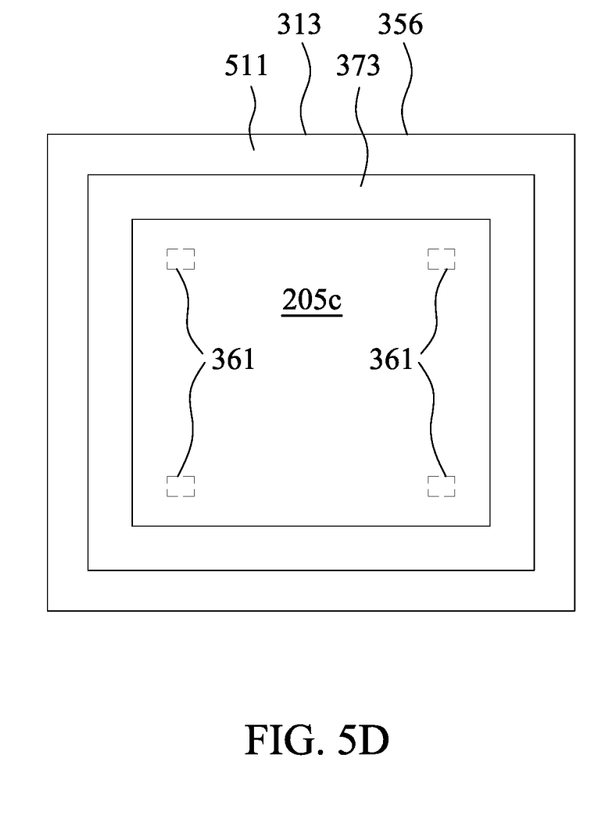
FIG. 5D illustrates another plan view of the inner pod cover in FIG. 5B including the coating deposited along a periphery of the inner pod base on the upper surface, according to embodiments of the disclosure.
Figure 5E:
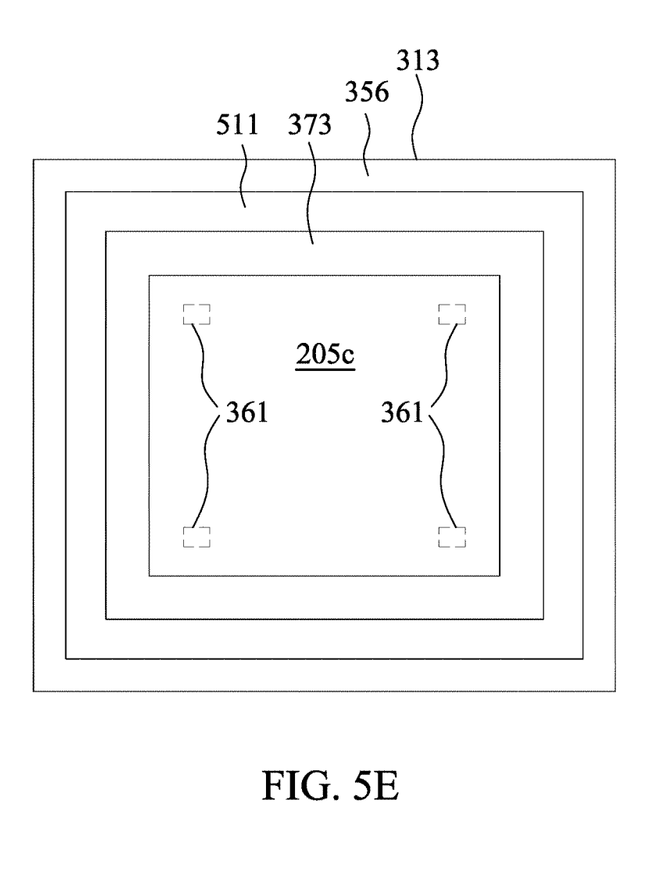
FIG. 5E illustrates a plan view of the inner pod cover in FIG. 5B including the coating spaced from the outer peripheral edges of the inner pod base, according to embodiments of the disclosure.

In some embodiments, the coating 511 is deposited on an entire upper surface 373 of inner pod base 356. In some embodiments, the coating 511 is deposited on the upper surface 373 along the peripheral portion of the inner pod base 356. FIG. 5C illustrates a plan view of the inner pod base eover 356 in FIG. 5B including the coating 511 deposited on an entire upper surface 373 of inner pod base 356, according to embodiments of the disclosure. FIG. 5D illustrates another plan view of the inner pod base 356 in FIG. 5B including the coating 511 deposited along a periphery of the inner pod base 356 on the upper surface 373, according to embodiments of the disclosure. In some other embodiments, the coating 511 is spaced from the outer peripheral edges 313 of the inner pod base 356. FIG. 5E illustrates a plan view of the inner pod base 356 in FIG. 5B including the coating 511 spaced from the outer peripheral edges 313 of the inner pod base 356, according to embodiments of the disclosure. It will be understood that the coating 511 can be deposited in any desired pattern or arrangement on the upper surface 373 as required by application and design, without departing from the scope of the disclosure.

Figure 5F:
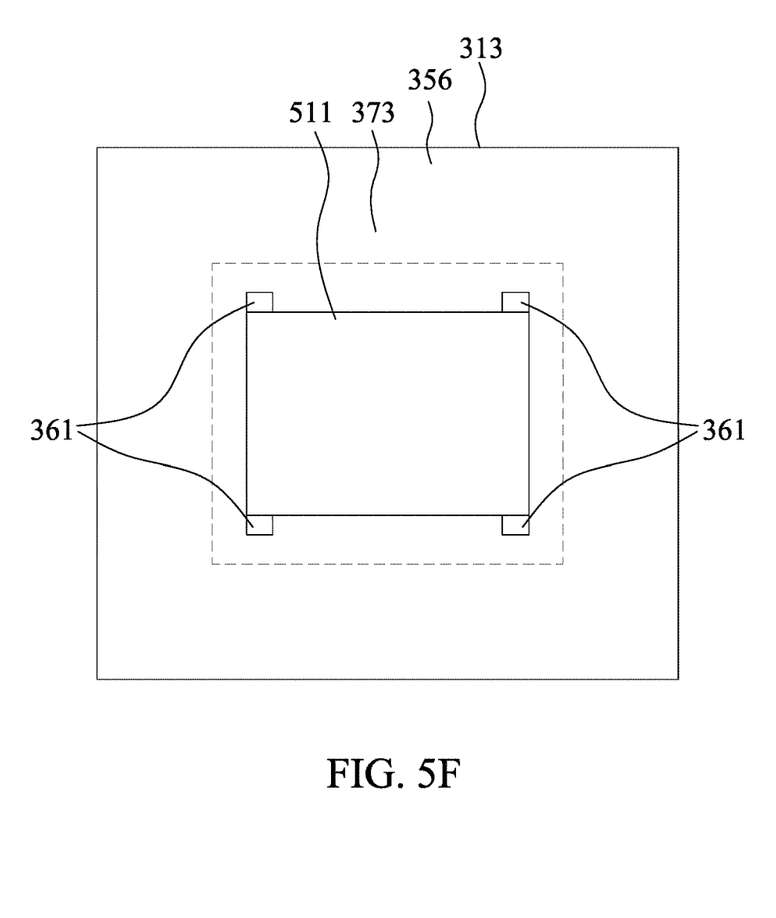
FIG. 5F illustrates a plan view of the inner pod cover in FIG. 5B including the coating deposited only on a portion of the upper surface between the restraining mechanisms, according to embodiments of the disclosure.

In some embodiments, the coating 511 is also deposited on one or more restraining mechanisms 361. In some embodiments, the coating 511 is deposited only on portion of the upper surface 373 between the restraining mechanisms 361. FIG. 5F illustrates a plan view of the inner pod base 356 in FIG. 5B including the coating 511 deposited only on a portion of the upper surface 373 between the restraining mechanisms 361, according to embodiments of the disclosure.

Additionally, in some embodiments, the coating 511 is deposited on the surface of the inner pod cover 380 that faces the reticle 205*c*.

In some embodiments, and as illustrated in FIGS. 5A and 5B, the inner pod 354 is handled by the rapid exchange device (RED) 214 that retrieves the desired reticle from the in-vacuum library (IVL) 212. In some embodiments, when the particular reticle is needed, the in-vacuum robot (IVR) 210 retrieves the desired reticle from the in-vacuum library (IVL) 212 and provides the reticle to the rapid exchange device (RED) 214. However, embodiments are not limited only to reticles handled at the rapid exchange device (RED) 214, and are equally applicable to reticles handled at all stage of the reticle handling system 201.

Figure 6:
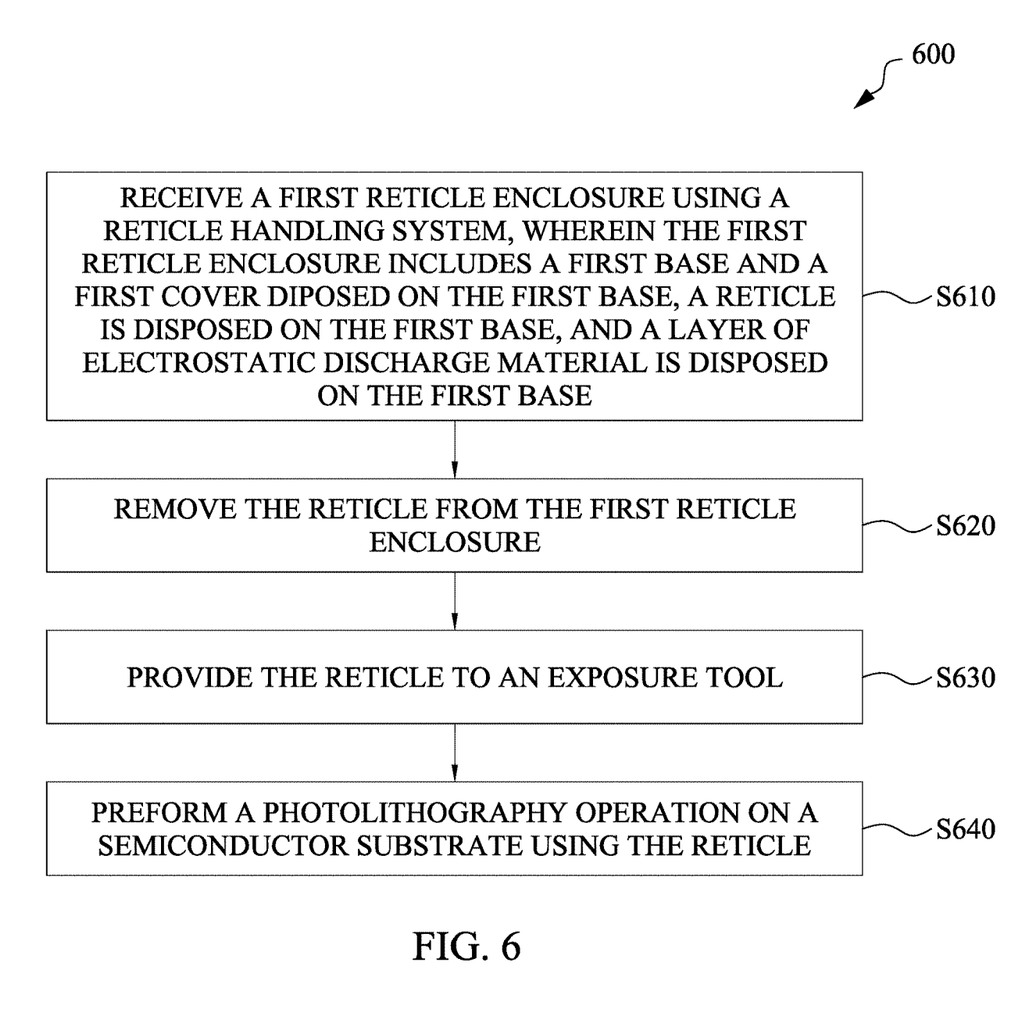
FIG. 6 illustrates a flow-chart of a method of handling a reticle enclosure, according to embodiments of the disclosure.

FIG. 6 illustrates a flow-chart of a method 600 of handling a reticle enclosure, according to some embodiments. It is understood that additional operations can be provided before, during, and after processes discussed in FIG. 6, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method 600 includes an operation S610 of receiving a first reticle enclosure using a reticle handling system. The first reticle enclosure includes a first base and a first cover disposed on the first base, a reticle is disposed on the first base, and a layer of electrostatic discharge material is disposed on the first base. In operation S620, the reticle is removed from the first reticle enclosure. In operation S630, the reticle is provided to an exposure tool. In operation S640, a photolithography operation is performed on a semiconductor substrate using the reticle.

Embodiments of the present disclosure are directed to reducing the electrostatic charges on the reticle to reduce particles (contaminants) from being attracted to the reticle and deposited on the reticle. By reducing the particles deposited, contamination of the EUV lithography system 101, the reticle handling system 201 and/or other associated components is reduced.

It will be understood that not all advantages have been necessarily discussed herein, no particular advantage is required for all embodiments or examples, and other embodiments or examples may offer different advantages.

According to some embodiments of the present disclosure, a reticle enclosure includes a base including a first surface, a cover including a second surface and disposed on the base, wherein the base and the cover form an internal space therebetween in which a reticle is to be placed, and a layer of electrostatic discharge material disposed on the first surface, wherein the electrostatic discharge material reduces electrostatic charges on the reticle when the reticle is placed in or removed from the reticle enclosure. In an embodiment, the layer of electrostatic discharge material covers an entire first surface. In an embodiment, the layer of electrostatic discharge material is disposed in only a portion of the first surface. In an embodiment, the reticle enclosure further includes a plurality of restraining mechanisms on the base and configured for securing the reticle in the reticle enclosure. The layer of electrostatic discharge material is disposed on a part of the first surface only between two or more restraining mechanisms. In an embodiment, the reticle enclosure further includes a plurality of restraining mechanisms on the base and configured for securing the reticle in the reticle enclosure. The layer of electrostatic discharge material is disposed on one or more restraining mechanisms of the plurality of restraining mechanisms. In an embodiment, the layer of electrostatic discharge material is spaced from outer edges of the base. In an embodiment, the layer of electrostatic discharge material includes a material including one or more selected from the group consisting of conductive materials and static dissipative materials.

According to some embodiments of the present disclosure, a reticle pod includes an outer reticle enclosure including an outer base and an outer cover disposed on the outer base and form a first internal space therebetween, an inner reticle enclosure positioned in the first internal space, the inner reticle enclosure including an inner base and an inner cover disposed on the inner base and forming a second internal space therebetween, a reticle arranged in the second internal space, and a layer of electrostatic discharge material disposed on the inner base. In an embodiment, the layer of electrostatic discharge material covers an entire surface of the inner base. In an embodiment, the layer of electrostatic discharge material is disposed in only a portion of a surface of the inner base. In an embodiment, the inner reticle enclosure includes a plurality of restraining mechanisms on the inner base, the plurality of restraining mechanisms are configured for securing the reticle in the inner reticle enclosure, and the layer of electrostatic discharge material is disposed on a surface of the inner base only between two or more restraining mechanisms. In an embodiment, the inner reticle enclosure includes a plurality of restraining mechanisms on the inner base, the plurality of restraining mechanisms are configured for securing the reticle in the inner reticle enclosure, and the layer of electrostatic discharge material is disposed on one or more restraining mechanisms of the plurality of restraining mechanisms.

According to some embodiments of the present disclosure, a method includes receiving a first reticle enclosure using a reticle handling system. The first reticle enclosure includes a first base and a first cover disposed on the first base, a reticle is disposed on the first base, and a layer of electrostatic discharge material is disposed on the first base. The method further includes removing the reticle from the first reticle enclosure, providing the reticle to an exposure tool, and performing a photolithography operation on a semiconductor substrate using the reticle. In an embodiment, transporting the reticle from the exposure tool to the reticle handling system, placing a reticle on the first base, and closing the first reticle enclosure by placing the first cover on the first base. In an embodiment, the layer of electrostatic discharge material is spaced from outer edges of the first base. In an embodiment, the layer of electrostatic discharge material includes polonium (Po-210). In an embodiment, the layer of electrostatic discharge material covers an entire surface of the first base. In an embodiment, the layer of electrostatic discharge material is disposed in only a portion of a surface of the first base. In an embodiment, placing the reticle on the first base includes placing the reticle on one or more first restraining mechanisms on the first base and closing the first reticle enclosure includes placing the first cover on the first base such that one or more second restraining mechanisms on the first cover contact the reticle, thereby securing the reticle in the first reticle enclosure, wherein the layer of electrostatic discharge material is disposed on a surface of the first base only between two or more restraining mechanisms. In an embodiment, placing the reticle on the first base includes placing the reticle on one or more first restraining mechanisms on the first base and closing the first reticle enclosure includes placing the first cover on the first base such that one or more second restraining mechanisms on the first cover contact the reticle, thereby securing the reticle in the first reticle enclosure, wherein the layer of electrostatic discharge material is disposed on the one or more first restraining mechanisms.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reticle enclosure, comprising:
   a base including a first surface;
   a cover including a second surface and disposed on the base, wherein the base and the cover form an internal space therebetween in which a reticle is to be placed;
   a layer of electrostatic discharge material disposed on the second surface, wherein the layer of the electrostatic discharge material reduces electrostatic charges on the reticle when the reticle is placed in or removed from the reticle enclosure; and
   a plurality of restraining mechanisms on the cover and configured for securing the reticle in the reticle enclosure,
   wherein, in plan view, the layer of electrostatic discharge material is confined to a portion of the second surface of the cover between of the plurality of restraining mechanisms.

2. The reticle enclosure of claim 1, wherein the layer of electrostatic discharge material has a quadrilateral shape when viewed in plan view.

3. The reticle enclosure of claim 1, wherein the layer of electrostatic discharge material includes a material including one or more selected from the group consisting of conductive materials and static dissipative materials.

4. The reticle enclosure of claim 1, wherein the layer of the electrostatic discharge material includes a radioactive material.

5. The reticle enclosure of claim 4, wherein the radioactive material includes polonium (Po-210).

6. The reticle enclosure of claim 1, wherein the plurality of restraining mechanisms are selected from the group consisting of clamps, grooves, pins, fixation blocks, and springs.

7. The reticle enclosure of claim 1, wherein the layer of electrostatic discharge material faces the reticle.

8. A reticle pod, comprising:
   an outer reticle enclosure including an outer base and an outer cover disposed on the outer base and form a first internal space therebetween;
   an inner reticle enclosure positioned in the first internal space, the inner reticle enclosure including an inner base and an inner cover disposed on the inner base and forming a second internal space therebetween;
   a reticle arranged in the second internal space;
   a layer of electrostatic discharge material disposed on the inner cover; and
   a plurality of restraining mechanisms on the inner cover of the inner reticle enclosure, the plurality of restraining mechanisms are configured for securing the reticle in the inner reticle enclosure,
   wherein, in plan view, the layer of electrostatic discharge material is confined to a portion of the inner cover between the plurality of restraining mechanisms.

9. The reticle pod of claim 8, wherein the layer of electrostatic discharge material has a quadrilateral shape when viewed in plan view.

10. The reticle pod of claim 8, wherein the layer of the electrostatic discharge material includes a radioactive material.

11. The reticle pod of claim 10, wherein the radioactive material includes polonium (Po-210).

12. The reticle pod of claim 8, wherein the plurality of restraining mechanisms are selected from the group consisting of clamps, grooves, pins, fixation blocks, and springs.

13. The reticle pod of claim 12, wherein the plurality of restraining mechanisms contact first and second surfaces of the reticle.

14. The reticle pod of claim 8, wherein the layer of electrostatic discharge material faces the reticle.

15. A reticle enclosure, comprising:
   an inner base;
   an inner cover arranged on the inner base and forming an internal space therebetween, a reticle being positioned in the internal space;
   a plurality of restraining mechanisms on the inner cover and in the internal space, the plurality of restraining mechanisms securing the reticle in position in the internal space; and
   a coating of an electrostatic discharge material disposed on the inner cover, wherein the electrostatic discharge material reduces attraction of contaminants to the reticle,
   wherein, in plan view, the coating of electrostatic discharge material is confined to a portion of the inner cover between the plurality of restraining mechanisms.

16. The reticle enclosure of claim 15, wherein the coating reduces electrostatic charges on the reticle when the reticle is placed in or removed from the reticle enclosure.

17. The reticle enclosure of claim 15, wherein the coating has a quadrilateral shape when viewed in plan view.

18. The reticle enclosure of claim 15, wherein the coating includes polonium (Po-210).

19. The reticle enclosure of claim 15, wherein the coating is deposited on the inner cover and facing the reticle.

20. The reticle enclosure of claim 15, wherein the plurality of restraining mechanisms are selected from the group consisting of clamps, grooves, pins, fixation blocks, and springs.

* * * * *